US012688897B2

(12) United States Patent
Mason et al.

(10) Patent No.: US 12,688,897 B2
(45) Date of Patent: Jul. 21, 2026

(54) KNOWN-FAILURE ERROR HANDLING IN A MEMORY SUB-SYSTEM

(71) Applicant: Micron Technology, Inc., Boise, ID (US)

(72) Inventors: Robert Winston Mason, Boise, ID (US); Scott Anthony Stoller, Boise, ID (US); Kyle Brock-Petersen, Boulder, CO (US)

(73) Assignee: Micron Technology, Inc., Boise, ID (US)

( * ) Notice: Subject to any disclaimer, the term of this patent is extended or adjusted under 35 U.S.C. 154(b) by 77 days.

(21) Appl. No.: 18/637,913

(22) Filed: Apr. 17, 2024

(65) Prior Publication Data

US 2024/0355402 A1 Oct. 24, 2024

Related U.S. Application Data

(60) Provisional application No. 63/460,259, filed on Apr. 18, 2023.

(51) Int. Cl.
*G11C 16/34* (2006.01)
*G11C 16/10* (2006.01)

(52) U.S. Cl.
CPC ........ *G11C 16/3459* (2013.01); *G11C 16/102* (2013.01); *G11C 16/3404* (2013.01)

(58) Field of Classification Search
None
See application file for complete search history.

(56) References Cited

U.S. PATENT DOCUMENTS

2022/0066868 A1* 3/2022 Betz ................... G06F 11/1068
2024/0296085 A1* 9/2024 Papandreou .......... G06F 11/076
* cited by examiner

*Primary Examiner* — Alfredo Bermudez Lozada
(74) *Attorney, Agent, or Firm* — Lowenstein Sandler LLP

(57) ABSTRACT

A system and method for a memory device for detecting, by a processing device, a failure exhibited by a set of cells of a memory device, estimating a severity of the failure, identifying, based on the severity of the failure, a failed subset of cells of the set of cells, and copying data from the failed subset of cells to a second set of cells of the memory device.

17 Claims, 9 Drawing Sheets

700 →

Detect a failure exhibited by a first set of cells of a memory device
710

Estimate a severity of the failure
720

Identify, based on the severity of the failure, a failed subset of cells of the first set of cells
730

Copy data from the failed subset of cells to a second set of cells of the memory device
740

Error Handling Flow 400

Normal Operation 410

Failure Detected? 420

NO

YES

Estimate Failure Severity 430

LOW RISK Failure 431

HIGH RISK Failure 435

UNKOWN Failure 437

Fold Most Recent Wordlines 432

Immediately Fold All Pages of a Block 438

Flag Block for Retirement 440

Return to Normal Operation 450

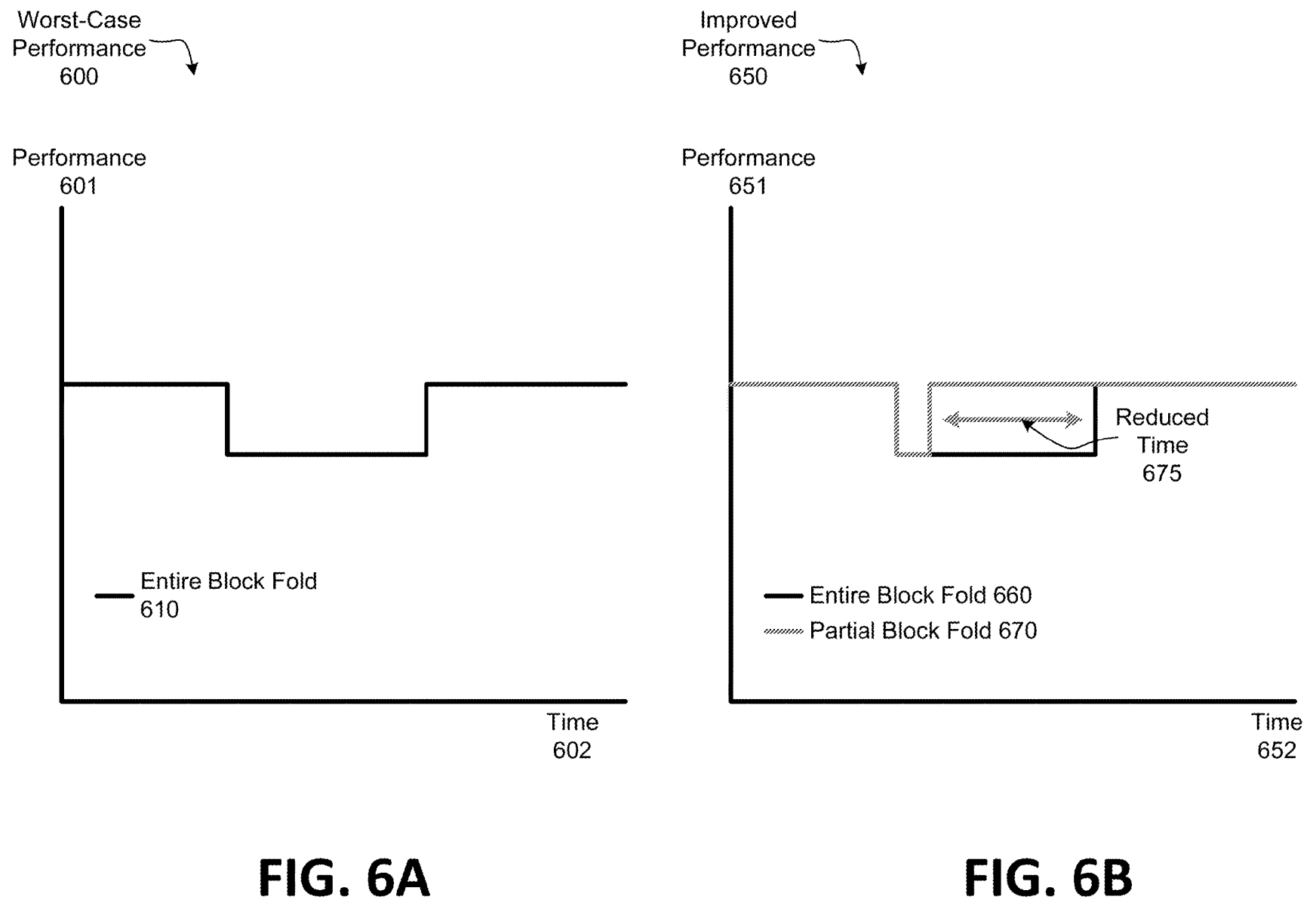

Worst-Case Performance 600

Performance 601

Entire Block Fold 610

Time 602

FIG. 6A

Improved Performance 650

Performance 651

Reduced Time 675

Entire Block Fold 660
Partial Block Fold 670

Time 652

Detect a failure exhibited by a first set of cells
of a memory device
710

Estimate a severity of the failure
720

Identify, based on the severity of the failure, a
failed subset of cells of the first set of cells
730

Copy data from the failed subset of cells to a
second set of cells of the memory device
740

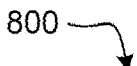

800

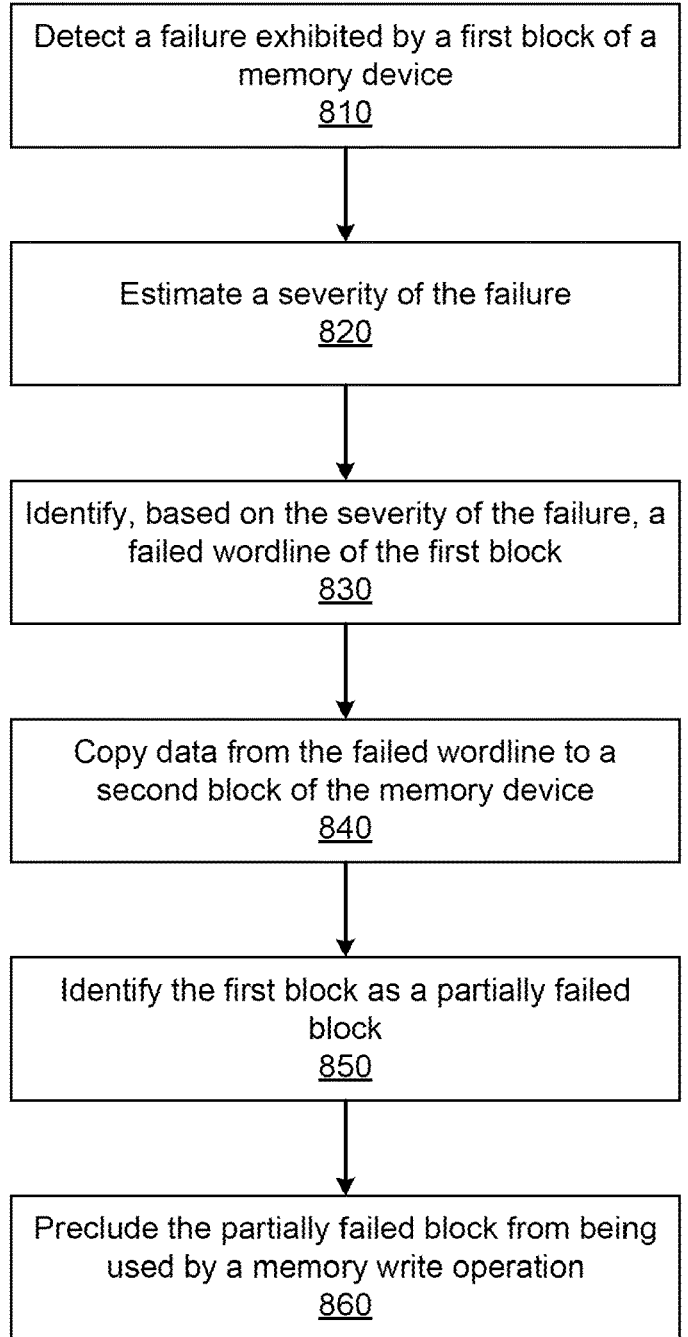

```
┌─────────────────────────────────────┐
│ Detect a failure exhibited by a      │
│ first block of a memory device       │
│                810                   │
└─────────────────────────────────────┘
                  │
                  ▼
┌─────────────────────────────────────┐
│   Estimate a severity of the failure │
│                820                   │
└─────────────────────────────────────┘
                  │
                  ▼
┌─────────────────────────────────────┐
│ Identify, based on the severity of   │
│ the failure, a failed wordline of    │
│ the first block                      │
│                830                   │
└─────────────────────────────────────┘
                  │
                  ▼
┌─────────────────────────────────────┐
│ Copy data from the failed wordline   │
│ to a second block of the memory      │
│ device                               │
│                840                   │
└─────────────────────────────────────┘
                  │
                  ▼
┌─────────────────────────────────────┐
│ Identify the first block as a        │
│ partially failed block               │
│                850                   │
└─────────────────────────────────────┘
                  │
                  ▼
┌─────────────────────────────────────┐
│ Preclude the partially failed block  │
│ from being used by a memory write    │
│ operation                            │
│                860                   │
└─────────────────────────────────────┘
```

FIG. 8

KNOWN-FAILURE ERROR HANDLING IN A MEMORY SUB-SYSTEM

RELATED APPLICATION

This application claims the benefit of U.S. Provisional Application No. 63/460,259 filed Apr. 18, 2023, the entire contents of which are hereby incorporated by reference.

TECHNICAL FIELD

Embodiments of the disclosure relate generally to memory sub-systems, and more specifically, relate to known-failure error handling in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIGS. 6a and 6b depict example performance charts illustrating a worst-case performance where an entire block is folded, and a variably improved performance where a partial block is folded, in accordance with some embodiments of the present disclosure.

FIG. 8 is a flow diagram of an example method in accordance with some embodiments of the present disclosure.

DETAILED DESCRIPTION

Figure 1:
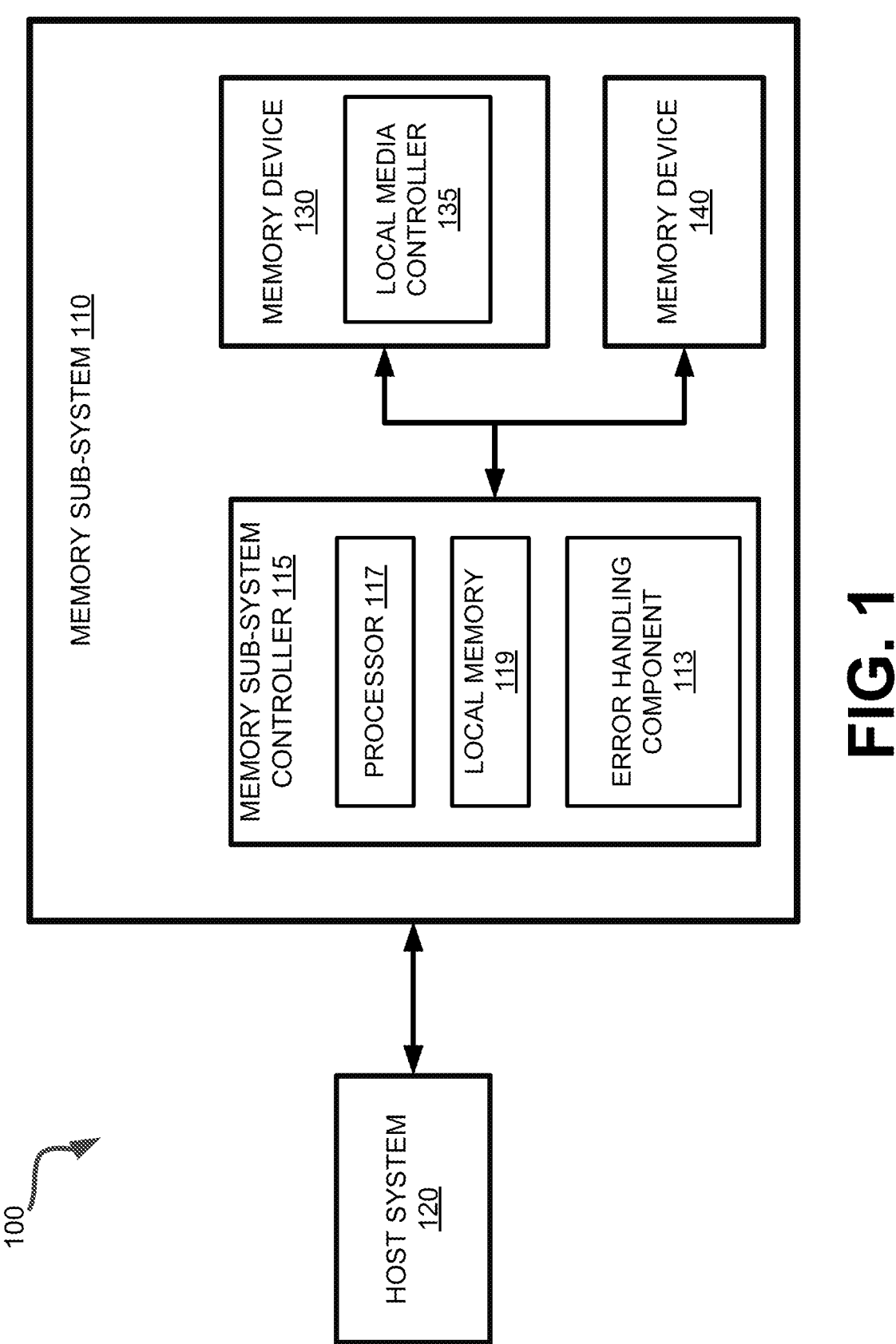
FIG. 1 illustrates an example computing system that includes a memory sub-system in accordance with some embodiments of the present disclosure.

Aspects of the present disclosure are directed to improving memory management through known-failure error handling in a memory device. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, a memory sub-system may be represented by a solid-state drive (SSD), which may include one or more non-volatile memory devices. In some embodiments, the non-volatile memory devices can be provided by negative-and (NAND) type flash memory devices. Other examples of non-volatile memory devices are described below in conjunction with FIG. 1. A non-volatile memory device is a package of one or more dice. Each die can include one or more planes. A plane is a portion of a memory device that includes multiple memory cells. Some memory devices can include two or more planes. For some types of non-volatile memory devices (e.g., NAND devices), each plane includes a set of physical blocks. Each block includes a set of pages. "Block" herein shall refer to a set of contiguous or non-contiguous memory pages. A "block" can refer to a unit of the memory device used to store data and can include a group of memory cells. An example of a "block" is an "erasable block," which is the minimal erasable unit of memory, while "page" is a minimal writable unit of memory. Each page includes a set of memory cells. A memory cell is an electronic circuit that stores information.

A memory device can include multiple memory cells arranged in a two-dimensional grid. The memory cells are formed onto a silicon wafer in an array of columns and rows. A memory cell includes a capacitor that holds an electric charge and a transistor that acts as a switch controlling access to the capacitor. Accordingly, the memory cell can be programmed (written to) by applying a certain voltage, which results in an electric charge being held by the capacitor. The memory cells are joined by wordlines, which are conducting lines electrically connected to the control gates of the memory cells, and bitlines, which are conducting lines electrically connected to the drain electrodes of the memory cells.

Depending on the cell type, each memory cell can store one or more bits of binary information and has various logic states that correlate to the number of bits being stored. The logic states can be represented by binary values, such as "0" and "1," or combinations of such values. A memory cell can be programmed (written to) by applying a certain voltage to the memory cell, which results in an electric charge being held by the memory cell, thus allowing modulation of the voltage distributions produced by the memory cell. A set of memory cells referred to as a memory page can be programmed together in a single operation, e.g., by selecting consecutive bitlines.

Precisely controlling the amount of the electric charge stored by the memory cell allows establishing multiple logical levels, thus effectively allowing a single memory cell to store multiple bits of information. A read operation can be performed by comparing the measured threshold voltages (Vt) exhibited by the memory cell to one or more reference voltage levels in order to distinguish between two logical levels for single-level cell (SLCs) and between multiple logical levels for multi-level cells.

Memory access operations (e.g., a programming (write) operation, an erase operation, etc.) can be executed with respect to sets of the memory cells, e.g., in response to receiving memory access commands from the host. A memory access operation can specify the requested memory access operation (e.g., write, erase, read, etc.) and a logical address, which the memory sub-system would translate to a physical address identifying a set of memory cells (e.g., a block).

Memory access operation failures ("failures") can occur within a block of a memory device. Some systems can treat a failure in a block (e.g., a fail to program or read a part of a block) as if the entire block has failed (e.g., a "failed block"). The system can relocate the data stored at the failed block to another block of the memory sub-system (also referred to herein as "folding"). For example, upon detecting a failure of one page of a block, some systems can presume the entire block has failed, and can relocate all the data stored on the failed block to another block of the memory sub-system (e.g., fold the entire block). Folding the entire block can include relocating data stored on non-failing pages which have a minimal risk of data loss to another block (e.g., folding the non-failing pages). Because a block is a minimal erasable unit of memory, after relocating all data from the failed block, some systems can retire the failed block. Retiring refers to the process of stopping the use of a block for purposes of host data programming due to unreliability and/or poor performance of the block. Retired blocks are precluded from being used to store host data. To retire a block, the system can modify metadata that identifies usable (or unusable) blocks of the memory device. Some systems can queue the failed block for immediate retirement even when the failure is localized to one or a few pages, rather than waiting for a garbage collection operation to queue the failed block for retirement.

The presumption that a failure in a block causes the entire block to become unusable can cause a system to perform unnecessary folding operations (e.g., data relocation and garbage collection operations). Systems that perform a high number of folding operations can experience write amplification, which can impact performance and reliability of the system. Systems that presume an entire block becomes unusable because of a failure in the block can prioritize recovering data that might already be safe over processing incoming operations. As a result, the host device and/or host device user can experience a lower Quality of Service (QOS) while the system pauses processing incoming operations to perform data relocation and garbage collection operations.

Aspects of the present disclosure address the above and other deficiencies by having a memory sub-system that improves memory management through known-failure error handling in a memory sub-system to intelligently determine which parts of a block have failed and which parts of the block subsequently have a high risk of data loss. In one embodiment, the memory sub-system controller can prioritize preserving data from the parts of the block which have a high risk of data loss (i.e., failed portions of the block), while leaving other parts of the block with a low risk of data loss undisturbed (i.e., non-failed portions of the block). In one embodiment, the memory sub-system controller can use blocks with failed portions (e.g., such as physical defects, etc.) as partially failed blocks. The memory sub-system can identify partially failed blocks, as well as the parts of a partially failed block that have failed (e.g., are physically or logically defective), and the parts of the partially failed block that have not failed. The memory sub-system can then continue to use the non-failed parts of a block until a garbage collection operation, which can involve retiring the partially failed blocks.

To realize these improvements, the memory sub-system controller can, upon detecting a failure exhibited by a set of cells of the memory device, estimate the severity of the failure. Based on the severity of the failure, the controller can identify a failed subset of cells of the set of cells of the memory device (e.g., a failed page within a failed block, etc.). The controller can copy data from the failed subset of cells to another location on the memory device to mitigate the risk of data loss. In some embodiments, the memory sub-system can indicate which subset(s) of cells have failed, and which subset(s) of cells have not failed. In some embodiments, the controller can flag the set of cells of the memory device to be eventually retired during garbage collection (e.g., during garbage collection, the flagged set of cells can be precluded from being used by a memory write operation to store data).

To estimate the severity of the failure, the controller can determine a known-failure mode of the failure. Known-failure modes can refer to observed voltage distribution patterns of a failure in a memory device that have been pre-defined during production of the memory device. Different known-failure modes can have different severities. In some embodiments, by categorizing the failure as one of multiple known-failure modes, the controller can estimate the severity of the failure. In some embodiments, known failure modes can be associated with additional metadata which can be used by the controller to estimate the severity of the failure. For example, a known-failure mode can include information to indicate that if wordline B has failed, in addition to a high risk of data loss at wordline B, there is a high risk of data loss at neighboring wordlines A and C. In another example, a known-failure mode can be associated with metadata indicating that the closest N number of pages to a failed page have a high risk of data loss. This additional information can be pre-determined during production of the memory sub-system, and can be stored as metadata in the memory sub-system.

To determine the known-failure mode of the failure, the controller can compare metadata associated with the failure (e.g., a page number, wordline, program cycle count, temperature, etc.) to one or more known-failure identifiers. Metadata associated with the failure can be associated with (i.e., can define) voltage distribution patterns. Known-failure identifiers can refer to criteria used by the controller to categorize the failure of the set of cells as one of multiple known-failure modes. Types and values of known-failure identifiers can be pre-determined during production of the memory device. In some embodiments, types and values of known-failure identifiers can be adjusted during operation of the memory device. For example, specific values can be determined at a die-level as a part of manufacturing the memory device. In another example, known-failure identifier types and values can be implemented by processes in the controller (e.g., firmware) which can be updated over the life of the memory device. Values of known-failure identifiers can include threshold conditions for corresponding values of metadata associated with the failure in the block. If the value derived from the metadata associated with the failure of the block satisfies a corresponding threshold condition of a given known-failure identifier, then the failure of the block can be associated with the given known-failure identifier. For example, a certain known-failure mode can be categorized by a failure of a certain page (e.g., where the known-failure identifier is a page number), and/or a failure at a certain program cycle count (e.g., where the known-failure identifier is a program cycle count threshold condition).

A known-failure mode can have multiple known-failure identifiers utilized by respective categorization criteria that should be satisfied for the failure in the block to be categorized as a given known-failure mode. When the controller determines that metadata associated with the failure in a block satisfies a condition based on a set of known-failure identifiers, the failure can be categorized as a corresponding known-failure mode. When the controller cannot make such a determination, the failure can be categorized as an unknown-failure mode. For example, upon detecting a failure exhibited by a set of cells (e.g., a block), the controller can compare metadata of a failed subset of cells such as a page number, to a corresponding page number known-failure identifier. If the controller determines that the page number satisfies the known-failure identifier (e.g., a page number threshold condition), the failure can be categorized as a known-failure mode.

Furthermore, each known-failure mode can be associated with a corresponding error-handling process that can be used to address the detected failure. An error handling process can include a folding policy and/or a retirement policy. For example, for a page-specific known-failure mode, (e.g., where only a single page of the block has failed), the corresponding error handling process can include a folding policy to only fold the failed page and no retirement policy. In another example, for an unknown-failure mode (e.g., where the controller is unable to categorize the failure as a known-failure mode), the corresponding error handling process can include a folding policy to fold the entire block and a retirement policy to remove the block from available memory access.

Advantages of the present disclosure include, but are not limited to, reducing the negative impact to the quality of service to a host at the time a failure is detected, since the controller needs to only preserve data stored on the parts of a block that have a high risk of data loss. The negative impact to the quality of service to the host can also be reduced when blocks with failures are marked for eventual (i.e., instead of immediate) retirement, and can continue to be used in the memory sub-system as partially failed blocks until a garbage collection operation. Additional advantages include a reduction in error handling operations during multi-page failures, a reduction in write amplification by reducing the amount of data folding from presumed entire block defectivity, and a reduction in host data loss risk through prioritization of failing page recovery.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO- DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a not-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), not-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes an error handling component 113 that can estimate the severity of a block failure and perform a corresponding error-handling flow. In some embodiments, the memory sub-system controller 115 includes at least a portion of the error handling component 113. In some embodiments, the error handling component 113 is part of the host system 120, an application, or an operating system. In other embodiments, local media controller 135 includes at least a portion of error handling component 113 and is configured to perform the functionality described herein.

The error handling component 113 can improve memory management by estimating a severity of a failure in a block based on known-failure identifiers. Error handling component 113 can contribute to memory management policies such as folding polices and/or block retirement policies. Known-failure error handling component can manage and/or contribute to memory access operations such as read operations, program operations, etc., and/or memory maintenance operations such as garbage collection, etc. Error handling component 113 can perform, or cause to be performed, operations to detect a failure of memory sub-system 110, estimate the severity of the failure, identify, based on the severity, a failed set of cells of memory device 130, and copy data from the failed set of cells of memory device 130 to another location on memory device 130.

When memory sub-system 110 transitions out of normal operation due to a detected failure, memory sub-system controller 115 can trigger an error handling flow, which can perform a pre-defined set of operations to determine and attempt to resolve the detected failure. Detectable failures can include, for example, program failures, read failures, uncorrectable error correcting code (UECC) failures, etc. As part of the error handling flow, error handling component 113 can use a failure detection routine to determine a known-failure mode by applying categorizing criteria (i.e., known-failure indicators) to the data state metrics (e.g., metadata) associated with the detected failure. A "data state metric" herein refers to a quantity that is measured or inferred from the state of data stored on the memory device. Data state metrics can be used to characterize voltage distributions, and can reflect (i.e., is equal to or derived by a known transformation from) the state of slow charge loss, the degree of latent read disturb, the temporal voltage shift, and/or other measurable functions of the data state. For example, the data state metric can be represented by the raw bit error rate (RBER), which is the number of bit error experienced by a given data block per unit of time. Data state metrics can be obtained by performing a read operation on a set of cells. In some embodiments, data state metrics can be obtained by performing a read strobe.

Each known-failure mode can be associated with a corresponding known-failure error handling process. Known-failure error handling processes can be preprogrammed during the manufacturing of memory sub-system 110. As described above, error handling processes can include a folding policy and/or a block retirement policy. For example, for a page specific known-failure identifier, the folding policy can be to only fold the failed page. In another example, for a failed entire block known-failure identifier, the folding policy can be to fold the whole block, and the retirement policy can be to immediately retire the block. In some embodiments, the folding policy can include queuing WLs affected by the detected failure for immediate folding. In some embodiments, the block retirement policy can include queuing the block for eventual retirement. The error handling process for an unknown failure can include folding the whole block. In some embodiments, the unknown failure error handling process can be a default error handling process (e.g., an "else-if") and can represent a worst-case error handling scenario.

During the failure detection routine, error handling component 113 can use the data state metrics from the detected failure to identify a set of possible known-failure modes. This metadata can include a page number, a wordline, a program cycle count, a temperature, etc. The set of possible failures can share the same known-failure identifiers. In some embodiments, the threshold condition values of a known-failure identifier can be different for different known-failure modes. Using known-failure identifiers, the failure detection routine can identify a known-failure mode and select the known-failure error handling process that is most likely to resolve the detected failure. In this way, rather than determining a specific failure of the block and applying a specific (e.g., unique) correction, error handling component 113 can efficiently categorize failures that are likely to behave like a known-failure mode. Known-failure modes can also be identified using a set of cause and effect flows.

Known-failure modes can be mapped to possible failure severities, such as high- or low-failure severity. The severity of the failure can indicate whether the failed set of cells are likely to cause neighboring sets of cells to also fail. A higher severity failure (e.g., a high severity failure) can indicate that the failed set of cells is likely to cause a neighboring set of cells to fail. A lower severity failure (e.g., a low severity failure) can indicate that the failed set of cells is unlikely to cause a neighboring set of cells to fail. The severity of each known-failure mode can be pre-determined during production of the memory device. Some known-failure modes can always be either a high- or low-severity failure mode, whereas some known-failure modes can be a high- or low-severity failure mode only when certain threshold conditions are satisfied. In some embodiments, the severity of the failure can depend on the metadata values associated with the failed set of cells that satisfy the known-failure identifier threshold conditions. For example, higher values of metadata associated with the failed set of cells that satisfy given known-failure identifier threshold conditions can indicate a higher severity of failure for the set of cells. In some embodiments, known-failure identifiers can be mapped to high- or low-failure severities. In some embodiments, the severity of the known-failure mode can depend on the severity associated with a given known-failure identifier. In some embodiments, the failure detection routine can identify a severity of the failure based on the severities of the known-failure identifiers for the determined known-failure mode, and select the known-failure error handling process that is most likely to address detected failure of the block. Further details regarding the failure detection routine are described below with reference to FIG. 4.

Error handling component 113 can estimate the severity of the block failure and confirm the severity estimate with additional checks. These additional checks can include memory access operations such as raw reads on non-failing pages, reads with offsets, valley health checks, valley count checks, etc. Further details regarding one example of an additional check, i.e., a valley health check, are described below with reference to FIG. 5. In some embodiments, error handling component 113 can confirm that the failure has been categorized with the most applicable known-failure mode. Based on the results of the additional checks, error handling component 113 can apply the known-failure error handling process of the known-failure mode with the best match to the detected failure. The best match can be based on information obtained from the verification operation in connection with the known-failure mode categorizations based on the known-failure identifiers. In some embodiments, when determining a known-failure mode category for a failure in a block, error handling component 113 can also determine a confidence level that the determined known-failure mode is accurate (e.g., is a best match).

Figure 2:
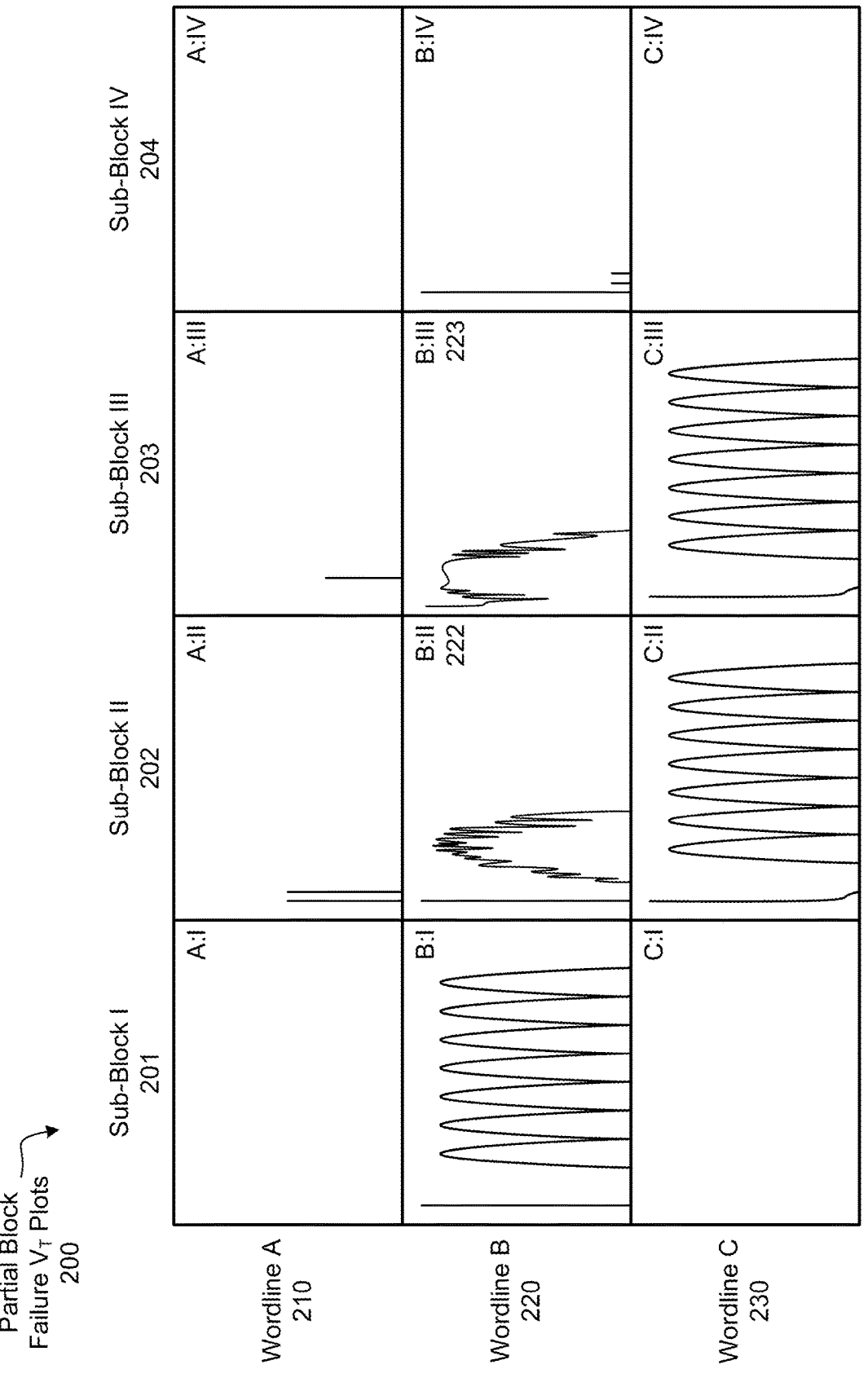
FIG. 2 depicts an example table illustrating example voltage distribution plots of a failure corresponding to a partial block failure, in accordance with some embodiments of the present disclosure.

FIG. 2 depicts an example table 200 illustrating example voltage distribution plots of an example partial block failure, in accordance with some embodiments of the present disclosure. Table 200 depicts voltage distribution plots for Wordline A 210, Wordline B 220, and Wordline C 230 respectively, at Sub-Block I 201, Sub-Block II 202, Sub-Block III 203, and Sub-Block IV 204, respectively.

When a block experiences a failure, the controller (e.g., such as memory sub-system controller 115 or local media controller 135 as described with respect to FIG. 1) can use data state metrics from the block to determine which parts of the block (e.g., sub-blocks, pages, wordlines, etc.) are affected by the failure, and which parts of the block are not affected by the failure. The controller can obtain information from other components of the memory device, such as a power management component of the memory device, a local memory component (e.g., local memory 119 as described with respect to FIG. 1), etc. For example, the controller can obtain current-draw information from the power management component regarding changes to the current along power rails to the memory device. As described above, the controller can use the data state metrics and other memory device information obtained from components of the memory device in conjunction with stored known-failure identifiers to estimate a severity of the failure. In some embodiments, known-failure modes can be categorized by a high risk of data loss or a low risk of data loss. In some embodiments, a known-failure mode can present either a high risk of data loss or a low risk of data loss based on additional information about the failure (e.g., information obtained about the block and/or block failure such as data state metrics for the block). In some embodiments, the severity of the failure can be estimated based on the known-failure mode categorization. In some embodiments, the controller can collect additional information about the detected failure by performing memory access operations on a failed part of the block and/or parts of the block adjacent to the failed part of the block.

The severity of the failure can indicate which parts of a block are at risk of data loss. For a low-severity failure, the parts of the block at risk of data loss can include the failed parts of the block and/or an estimated quantity of neighboring un-failed parts of the block. For a high-severity failure, the cells at risk of data loss can include the failed part of the block and an indeterminant amount of the remaining neighboring parts of the block (i.e., it can be unknown whether a failed subset(s) of cells will cause failures to neighboring subset(s) of cells). The parts of the block at risk of data loss for a given known failure mode can be stored as metadata associated with the known-failure mode. Thus, based on the estimated severity of the failure (and accompanying metadata), the controller can determine which parts of the block are at risk of data loss, and which parts of the block are not at risk of data loss. The controller can copy the data stored at the part of the block that is at risk of data loss (i.e., fold the at risk subset(s) of cells) to another block and leave the remaining data stored at the block untouched.

In the illustrative example of FIG. 2, a part of a block, Wordline B 220, has experienced a failure at Sub-Block II 202 (i.e., table entry B: II 222), and at Sub-Block III 203 (i.e., table entry B: III 223). Wordline A 210 and Wordline C 230 have not experienced failures, and thus only Wordline B 220 is impacted. The controller can perform memory access operations (e.g., such as a read strobe) on Wordline A 210, Wordline B 220, and Wordline C 230, and can determine that only Wordline B 220 has experienced a failure. Based on data state metrics collected from Wordline B 220, the controller can determine whether to preserve the stored data by folding the stored data into another block. In some embodiments, the controller can program dummy data to Wordline B 220. In some embodiments, if the controller determines that the data state metrics from Wordline B 220 do not satisfy one or more threshold conditions of known-failure identifiers, the controller can perform a default error handling operation. In some embodiments, the default error handling operation can include folding the entire block. In some embodiments, the controller can flag the partially failed block for eventual retirement.

Figure 3:
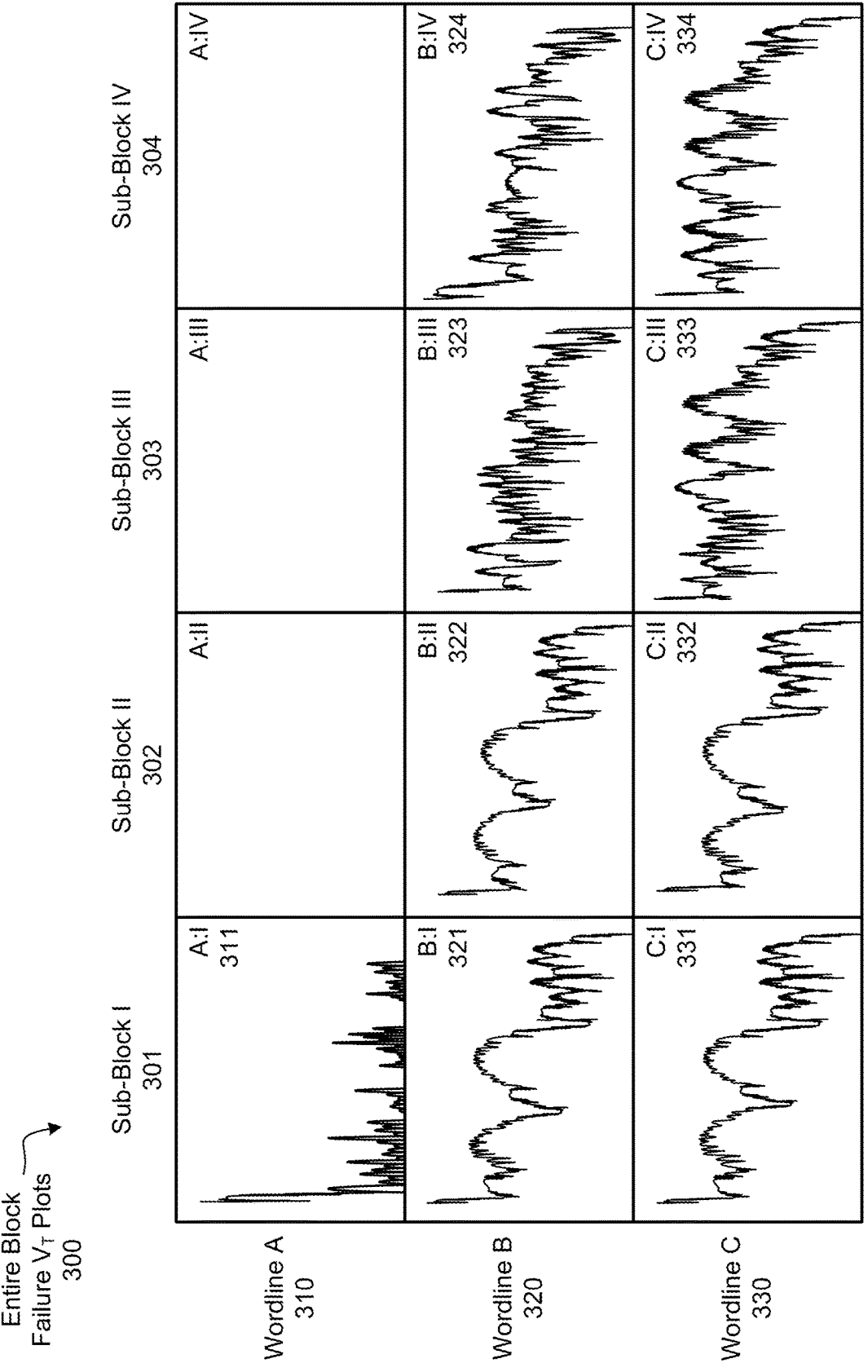
FIG. 3 depicts an example table illustrating example voltage distribution plots of a failure corresponding to an entire block failure, in accordance with some embodiments of the present disclosure.

FIG. 3 depicts an example table 300 illustrating example voltage distribution plots of an example entire block failure, in accordance with some embodiments of the present disclosure. Table 300 depicts voltage distribution plots for Wordline A 310, Wordline B 320, and Wordline C 330 respectively, at Sub-Block I 301, Sub-Block II 302, Sub-Block III 303, and Sub-Block IV 304, respectively.

When a block experiences a failure, the controller (e.g., such as memory sub-system controller 115 or local media controller 135 as described with respect to FIG. 1) can detect which wordlines are affected by the failure, and which wordlines are not affected by the failure based on data state metrics of portions of each wordline. The controller can use the data state metrics in conjunction with stored known-failure identifiers to estimate a severity of the failure. In some embodiments, the severity of the failure can be estimated with additional information from the detected failure. In some embodiments, the controller can collect additional information (e.g., metadata) about the detected failure by performing memory access operations on the failed wordline(s) and/or wordline(s) adjacent to the failed wordline(s). Based on the estimated severity of the failure, the controller can determine which wordlines need to be folded, and which wordlines do not need to be folded.

In the illustrative example, Wordline A 310 has experienced a failure at Sub-Block I 301 (i.e., table entry A:1 311), and Wordline B 320 and Wordline C 330 have experienced failures at Sub-Block I 301 (i.e., table entries B:1 321 and C:1 331 respectively), Sub-Block II 302 (i.e., table entries B:2 322 and C:2 332 respectively), Sub-Block III 303 (i.e., table entries B:3 323 and C:3 333 respectively), and Sub-Block IV 304 (i.e., table entries B:4 324 and C:4 334 respectively). The controller can perform memory access operations on Wordline A 310, Wordline B 320, and Wordline C 330, and can determine that all three wordlines have experienced a failure. In some embodiments, the controller can obtain data state metrics by performing memory access operations (e.g., a read strobe) on Wordline A 310, Wordline B 320, and Wordline C 330. In the illustrative example, the controller can determine that the data state metrics collected from the respective wordlines satisfy threshold conditions of known-failure indicators for a known-failure mode of an entire failed block. The controller can determine to preserve the stored data by folding the stored data into another block. In some embodiments, if the controller determines that the collected data state metrics do not satisfy threshold conditions of known-failure identifiers, the controller can perform a default error handling operation. In some embodiments, the default error handling operation can include folding the entire block. In some embodiments where the entire block has been folded, the controller can flag the block for immediate retirement.

Figure 4:
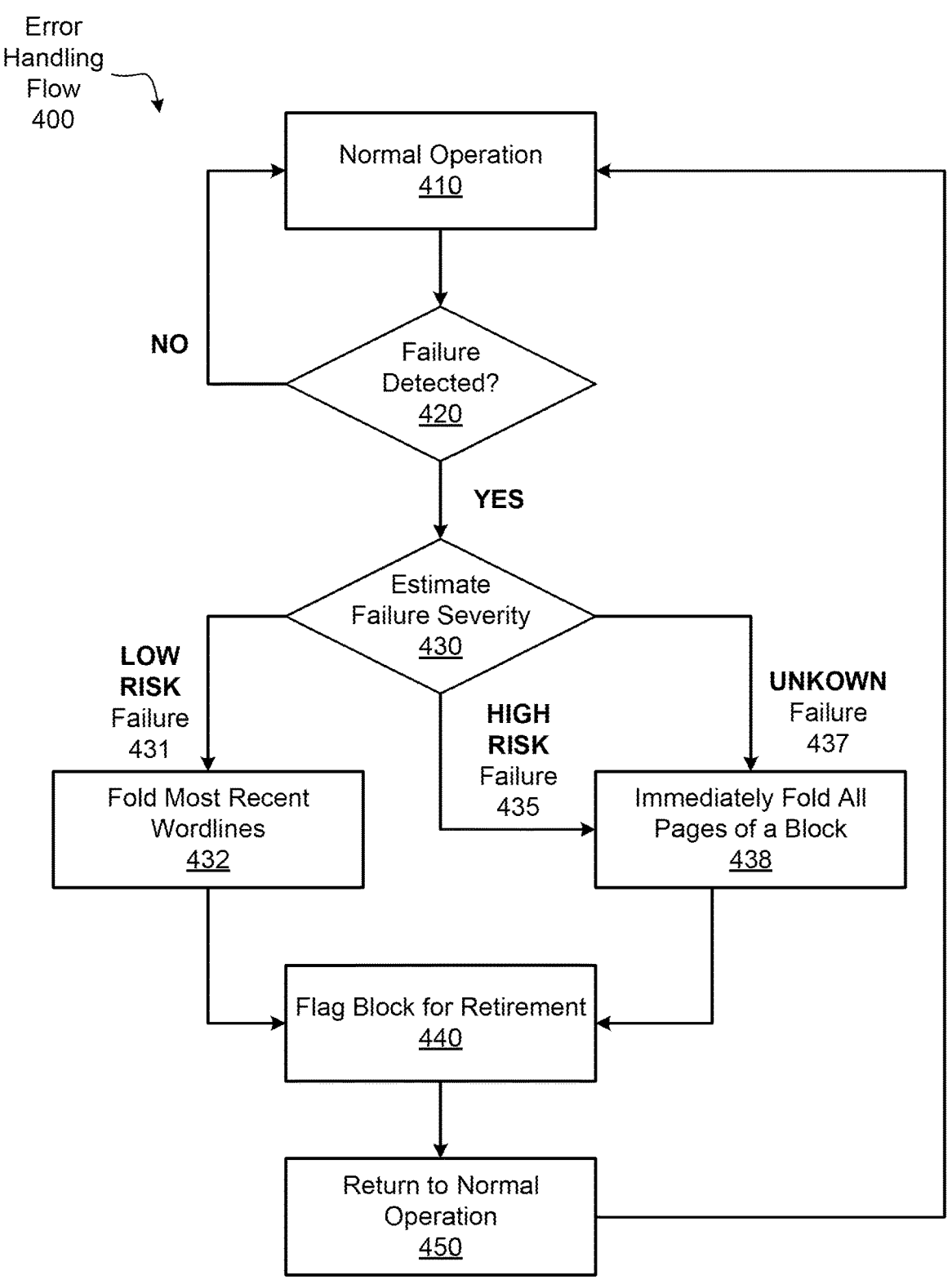
FIG. 4 illustrates an example of an error handling flow which can be implemented during an error detection routine, in accordance with some embodiments of the present disclosure.

FIG. 4 is a flow diagram of an example of an error handling flow 400, according to some embodiments of the present disclosure. Error handling flow 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, error handling flow 400 is performed by the error handling component 113 of FIG. 1. Although shown in a particular sequence or order, unless otherwise specified, the order of the processes can be modified. Thus, the illustrated embodiments should only be understood as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the controller implementing the error handling flow 400 is engaging in normal operation. Normal operation can occur when the controller has not detected an error in the memory sub-system. In some embodiments, where an error flag such as a program fail status can cause the controller to detect an error in the memory sub-system, normal operation can occur when the error flag does not indicate an error (e.g., when the program fail status is false—where false does not indicate a program fail). For example, normal operation can include performing actions such as processing host requests, performing memory maintenance processes (e.g., garbage collection, etc.) on the memory device, and/or performing memory access operations (e.g., read operations, write operations, erase operations etc.). Normal operation can include operations to detect failures in the memory device, such as operation 420 described below.

At operation 420, the controller determines whether a failure has been detected. The controller can include a failure detection process which dynamically updates a failure status (e.g., an error flag, a program failure status, etc.) upon detecting a memory device failure. In some embodiments, the failure status can include a failure flag generated by the failed process. If no failure is detected, the controller returns to (or continues) operation 410 (i.e., normal operation). In some embodiments, the failure detection process can run in the background (i.e., parallel to operation 410). In some embodiments, the background failure detection process can interrupt operation 410 when a failure is detected. In some embodiments, the controller can periodically perform operation 420 (i.e., failure detection operation) as part of operation 410 (i.e., as a serial process of normal operations). If a failure is detected, the controller can initiate an error handling flow. In some embodiments, the error handling flow can include operations such as operation 430 described below.

At operation 430, the controller estimates a severity of the memory device failure. In some embodiments, the memory device failure can be caused by a memory device defect. The memory device defect can be, for example, a physical defect (e.g., physical memory device damage, a logical defect, a manufacturing defect etc. In some embodiments, the memory device defect can occur as the result of an error in the manufacturing process for the memory device. The controller can perform memory access operations on the failed portion of the memory device to collect data state metrics, and estimate the failure risk level. Using the data state metrics from the memory device failure, and known-failure identifiers, the controller can categorize the known-failure mode of the memory device caused by the failure in the memory device as a known-failure mode. In some embodiments, the controller can categorize the memory device failure as an unknown-failure mode. In some embodiments, the controller can read wordlines adjacent to a failed part of the memory device to collect additional information about the failed part of the memory device. In some embodiments, the controller might be unable to perform memory access operations on the failed portion of the memory device (e.g., such as due to extreme failure or physical defects of the failed portion). If the controller determines that data state metrics from the failed portion of the memory device satisfy threshold values of known-failure identifiers for a given known-failure mode (i.e., a known-failure mode or an unknown-failure mode), the controller can implement the known-error handling process that corresponds to the given known-failure mode. Based on a determined known-failure mode, the controller can estimate whether the failure of the memory device is a low risk failure 431, a high risk failure 435, or an unknown failure 437. In some embodiments, known-failure identifiers for low risk failures 431 can be stored in the memory sub-system. In some embodiments, known-failure identifiers for high risk failures 435 can be stored in the memory sub-system.

The severity of the memory device failure can be based on a failure at one or more wordlines, and the potential of the failed wordline(s) to affect adjacent wordlines in the block. In some embodiments, the severity of the failure is not based strictly on the number of affected wordlines. For example, where a memory device failure causes all but one wordline of a block to fail, provided there is a minimal risk (e.g., a low risk as pre-defined during production of the memory device) that the one non-failing wordline will be affected by the adjacent failing wordlines, the controller can classify the memory device failure as a low risk failure 431. In another example, where a memory device failure causes only a single wordline of a block to fail, provided there is enough risk (e.g., a high risk as pre-defined during production of the memory device) that the non-failing wordlines will be affected by the single adjacent failing wordline, the controller can classify the memory device failure as a high risk failure 435.

The known-failure modes with a low risk failure 431 and/or a high risk failure 435 can be determined during production of the memory device. In some embodiments, a known-failure mode can be a be a low risk failure 431 or a high risk failure 435 based on values of metadata associated with the failed wordline(s). For example, lower values of metadata associated with the failed wordline(s) can indicate (by satisfying certain known-failure mode criteria) a given known-failure mode and a low risk failure 431. However, in another example, larger values of the metadata associated with the failed wordline can indicate the same given known-failure mode and a high risk failure 435. In some embodiments, the threshold conditions of known-failure mode criteria (e.g., known-failure identifiers as described above) that distinguish a low risk failure 431 from a high risk failure 435 can include factors such as manufacturing conditions, memory device structure, per-cell memory densities, operating conditions, etc. Upon categorizing the severity of the memory device failure as either a low risk failure 431, a high risk failure 435, or an unknown failure 437, the controller can fold the respective portions of the block according to the risk characterization, as described below in operation 432 and operation 438.

At operation 432, responsive to the controller estimating the memory device failure to be a low risk failure 431, the controller can identify the wordlines used in the most recent memory access operations (e.g., the most recently written wordlines). The controller can copy data from the most recently accessed wordlines to another block (e.g., the controller can fold the data on the most recently written wordlines into another block). In some embodiments, by collecting data state metrics associated with the failed portion of the memory device in response to a program status failure, the controller can identify and fold only the failed wordline (i.e., the most recently written wordline which caused the program status failure), and any previously programmed wordline(s) which are at risk for data loss (e.g., as determined based on the failure severity and known-failure mode of the most recently written wordline). The controller can leave the remaining previously programmed wordline(s) that are not at risk for data loss untouched. In some embodiments, upon copying the data from the at-risk wordline(s) to another block, the controller can re-program the failed wordline with dummy data. In some embodiments, the controller can also re-program the at-risk wordline(s) with dummy data. In this way, the block can appear to be filled (i.e., having no wordlines that could accept programmed data), and the controller does not inadvertently attempt to program new data to the at-risk wordlines of the block. In some embodiments, the memory device can include a metadata structure to store threshold values of known-failure identifiers for the low risk failure 431 that correspond to given data state metrics of a memory device failure.

At operation 438, responsive to the controller characterizing the estimated memory failure as a high risk failure 435 or an unknown failure 437, the controller can fold all wordlines of a block. In some embodiments, error handling flow 400 does not include characterizations for a high risk failure 435 and/or an unknown failure 437, instead performing operation 438 when conditions are not met to categorize the memory failure as a low risk failure 431. In some embodiments, the memory device can include a metadata structure to store threshold values of known-failure identifiers for the high risk failure 435 that correspond to given data state metrics for a memory device failure. In some embodiments, the memory device can include a metadata structure to store known-failure identifiers that can indicate an unknown failure 437.

At operation 440, the controller flags the block for retirement. Blocks with a low risk failure 431 can be flagged for eventual retirement (e.g., during garbage collection). In some embodiments, blocks with a high risk failure 435 or an unknown failure 437 can be flagged for eventual retirement. Blocks with a high risk failure 435 or an unknown failure 437 can be flagged for immediate retirement. Immediate retirement can include performing all, or part of garbage collection on the flagged block responsive to flagging the block. In some embodiments, block retirement is handled by the garbage collection process. In some embodiments, immediate retirement can be performed as a parallel operation. Immediate retirement can cause the performance of the memory sub-system to degrade. For example, immediate retirement can interrupt normal operation (i.e., operation 410), delay returning to normal operation, and/or increase latency time experienced by a host, such as host system 120 as described with respect to FIG. 1.

At operation 450, the controller concludes error handling flow 400 and returns to normal operation.

Figure 5:
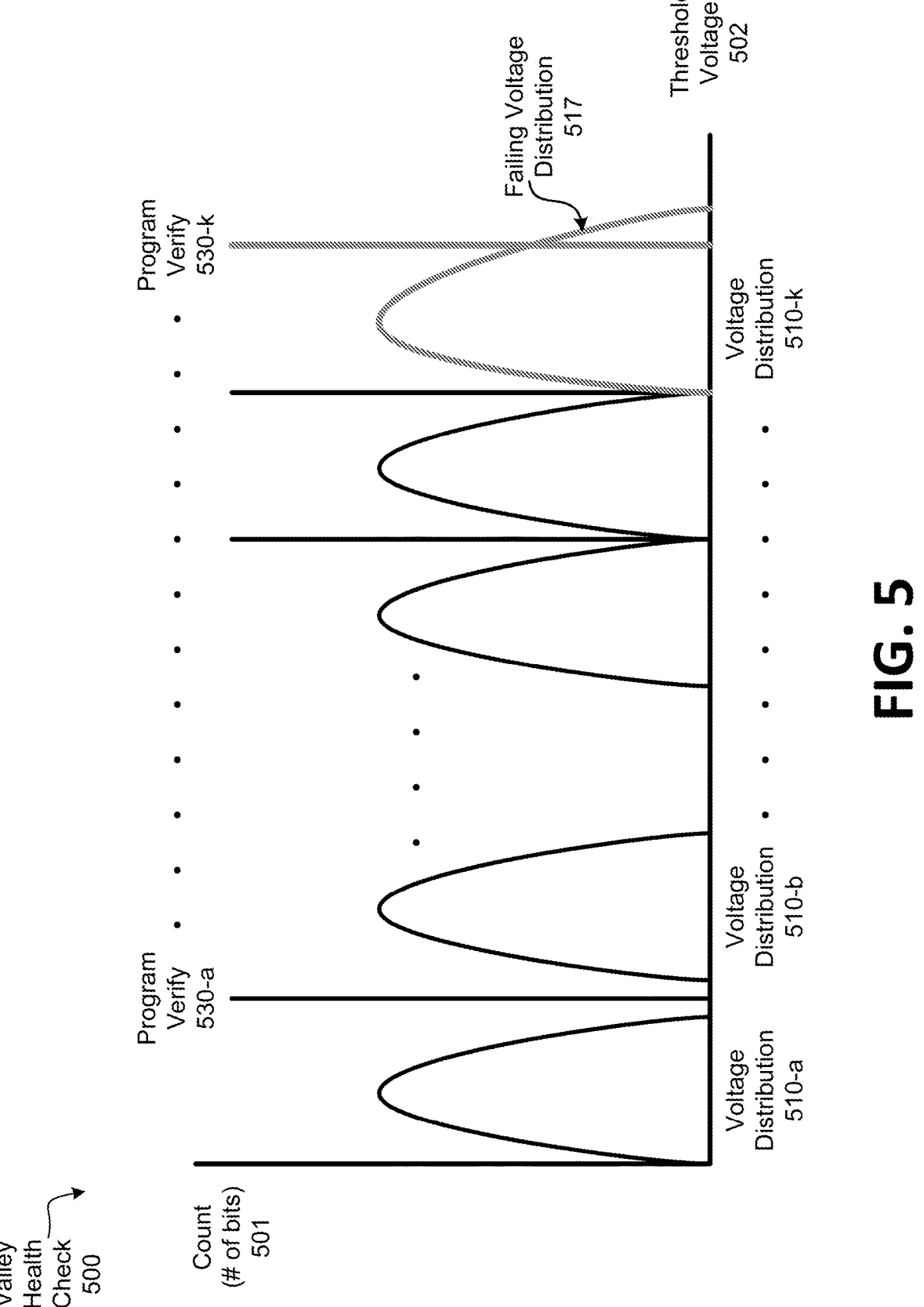
FIG. 5 depicts an example known-failure identifier check by illustrating a valley health check, in accordance with some embodiments of the present disclosure.

FIG. 5 depicts an example of plot 500 illustrating a known-failure identifier check, specifically, a valley health check, in accordance with some embodiments of the present disclosure. Plot 500 illustrates an example of voltage distributions 510 for a set of memory cell (e.g., a SLC, MLC, TLC, or QLC memory cells) as a count (# of bits) 501 with respect to threshold voltage 502. The memory cell can be programmed to a threshold voltage that falls within one of a predefined set of voltage distributions 510-a to 510-k respectively. Voltage distribution 510-a to 510-k can each represent a respective data state. For example, in a TLC memory device, voltage distribution 510-a can represent level 0 (L0), voltage distribution 510-b can represent level 1 (L1), and so forth on up to voltage distribution 510-k, which can represent level 7 (L7).

Voltage distributions 510 can be separated by some margin (i.e., a valley). By applying a sense voltage (i.e., program verify 530) within the valley, a controller (e.g., memory sub-system controller 115 or local media controller 135 as described with respect to FIG. 1) can distinguish between memory cells of each voltage distribution 510. A controller can verify whether voltage distributions 510 have shifted (e.g., overtaken a valley that previously existed when the cells were programmed) by applying a program verify 530 voltage at each of the read level voltages for the set of memory cells. The program verify 530 can return data state metrics that can indicate the health of the given voltage distribution. For example, in the illustrative example, program verify 530-k can return data state metrics that indicate that voltage distribution 510-k has shifted such that it has become a failing voltage distribution 517. In some embodiments, if the program verify 530 voltage intersects a single voltage distribution 510, the voltage distribution 510 intersected by the program verify 530 can be referred to as a failing voltage distribution 517. If the program verify 530 voltage falls between two voltage distribution 510, or intersects the intersection of two voltage distribution 510, the two voltage distribution 510 might not be referred to as a failing voltage distribution 517. For example, program verify 530-a falls between voltage distribution 510-a and voltage distribution 510-b, and thus neither voltage distribution 510-a nor voltage distribution 510-b are a failing voltage distribution 517 with respect to program verify 530-a. In another example, program verify 530-k intersects voltage distribution 510-k, and thus voltage distribution 510-k can be referred to as a failing voltage distribution 517 with respect to program verify 530-k.

A valley health check can return a quantity of failing voltage distribution 517, which can represent that the voltage distribution 510 have shifted from their programmed positions. In some embodiments, the valley health check can return identifiers of the failing voltage distribution 517 (e.g., "L1," "L2," etc.).

FIGS. 6a and 6b depict example performance charts illustrating a worst-case performance graph 600 where an entire block is folded, and a variably improved performance graph 650 where a block is partially folded, in accordance with some embodiments of the present disclosure.

Worst-case performance graph 600 shows the performance 601 of an entire block fold 610 with respect to time 602. A entire block fold 610 can occur when a controller (e.g., such as memory sub-system controller 115 and/or local media controller 135 as described with respect to FIG. 1) estimates a memory device failure to be a high risk or an unknown risk, and in response, folds the entire block (e.g., such as by performing operation 438 as described with respect to FIG. 4 in response to characterizing a memory device failure as a high risk failure 435 or an unknown failure 437). During an entire block fold 610, the controller immediately folds the entire block which impacts or even halts concurrent memory access operations. In some embodiments, entire block fold 610 can be performed as a parallel process to mitigate the performance impact of the operation.

Improved performance graph 650 shows the performance 651 of a partial block fold 670 with respect to time 652 in comparison to an entire block fold 660. A partial block fold can occur when the controller estimates the memory device failure to be a low risk, and in response, folds the at-risk wordlines (e.g., such as performing operation 432 as described with respect to FIG. 4 in response to characterizing the memory device failure as a low risk failure 431). A wordline can be at risk if the failure occurred at the wordline and/or if the wordline is likely to be impacted by a failure elsewhere in the block. During a partial block fold 670, the controller immediate folds at-risk wordlines, and leaves other wordlines untouched. This can result in a variably reduced time 675 compared to the entire block fold 660 (e.g., where reduced time 675 represents a negative performance impact). Reduced time 675 can vary based on the number of wordlines to be folded in partial block fold 670. In some embodiments, partial block fold 670 can be performed as a parallel process to mitigate the performance impact of the operation.

Figure 7:
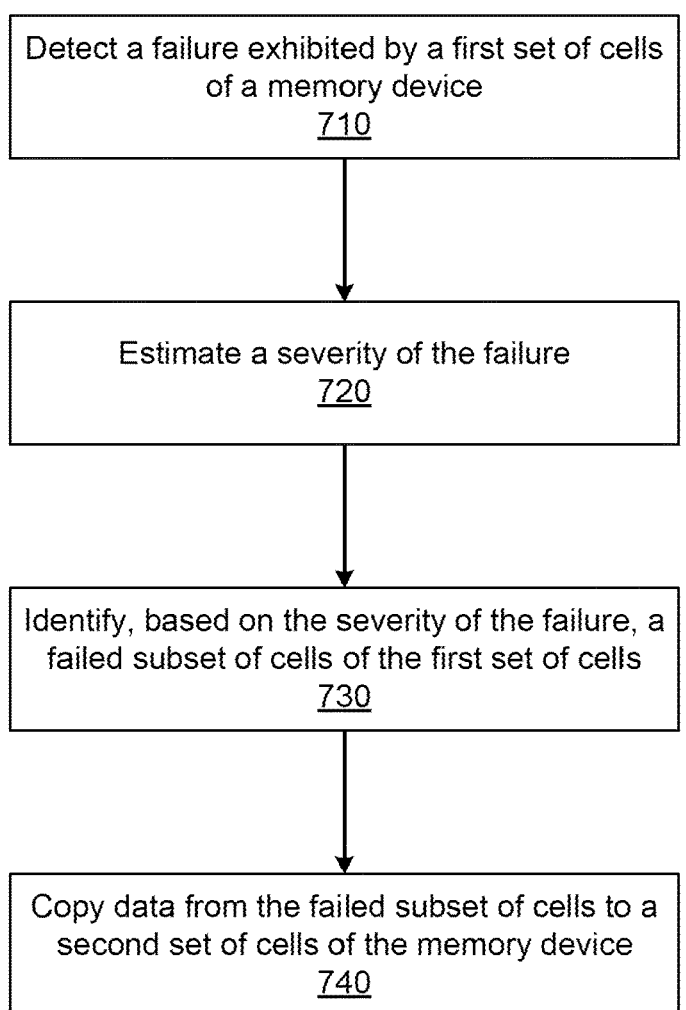
FIG. 7 is a flow diagram of an example method in accordance with some embodiments of the present disclosure.

FIG. 7 is a flow diagram of an example method 700 to according to some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the error handling component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, the controller implementing the method detects a failure exhibited by a set of cells of a memory device. A failure can occur when the controller attempts to perform memory access operations, and the memory access operations are non-functional. In some embodiments, the cause of the non-functional behavior can be the result of physical defect of the memory device (i.e., a location on the memory device might be physically defective). The failure can be detected as part of normal memory processes (e.g., a read operation, program operation, garbage collection, etc.), or as a part of a failure detection process. Upon detecting the failure, the controller can indicate the failure with, for example, a failure flag. In some embodiments, the controller can indicate the failure with a program failure status. In some embodiments, the set of cells can be a block.

At operation 720, the controller can estimate a severity of the failure. The controller can collect information (i.e., data state metrics) about the failure by performing a read strobe on the set of cells. In some embodiments, the controller can analyze the voltage threshold sweep data with a read strobe. Based on the returned data state metrics about the cells, the controller can determine whether data state metrics from the failure exhibited by the set of cells satisfy corresponding threshold conditions of known-failure identifiers.

The memory sub-system can include a metadata structure of known-failure identifier threshold condition values that correspond to a given data state metric returned by the read strobe. The controller can determine whether the returned data state metric satisfies threshold conditions of the stored known-failure identifiers. In some embodiments, threshold conditions of the known-failure identifiers can be stored as metadata. Known-failure identifiers can be categorized by severity. In some embodiments, severity categories can include a high severity (i.e., high risk) and a low severity (i.e., low risk). The values of threshold conditions that define a high severity or a low severity can be determined during production of the memory device. In some embodiments, the controller can categorize known-failure identifiers as high risk or low risk, where high risk indicates that the risk of losing data across the whole block is higher than a risk threshold, and low risk indicates that the risk of losing data across the whole block is lower than a risk threshold. In some embodiments, the value of the risk threshold can be determined during production of the memory device. In some embodiments, the value of risk threshold can be dependent on the operating conditions of the memory device.

In some embodiments, when estimating the severity of the failure, the controller can identify memory cells directly associated with the failure (i.e., "failed memory cells"). The failure can be related to a physical location and/or logical location of the failed memory cells on the memory device. For example, the failed memory cells can be connected by a wordline, page, etc., and/or store the parts of a shared data object. The controller can estimate the severity of the failure by determining the likelihood that the failure at the failed memory cells will catastrophically affect the set of cells containing the failed memory cells. For example, if the failed memory cells are unlikely to affect the data stored in other memory cells of the set of cells (e.g., based on a categorization of the failure, and known responses to the known-failure identifier as determined, for example, during production of the memory device), the controller can categorize the failed memory cells and resulting memory device failure as a low risk. However, if the failed memory cells are likely to affect the data stored in other memory cells of the block (i.e., if data state metrics from the memory cells satisfy a risk threshold), the controller can categorize the failed memory cells and resulting memory device failure as a high risk. If the failure detected by the controller does not match any known-failure modes, the controller can assume a catastrophic failure (i.e., a worst case failure where the entire set of cells should be folded), and categorize the failed memory cells and resulting memory device failure as an unknown risk. In some embodiments, the controller can treat high risk failures and unknown risk failures as the same (e.g., the controller can fold the entire block for both high risk and unknown risk failure characterizations). In some embodiments, the quantity of failed memory cells can indicate a severity.

The controller can initiate a verification operation to confirm that the threshold conditions of the known-failure identifier are satisfied by values from the data state metrics for the failed memory cells. In some embodiments, the verification mode can be a known-failure check, such as a valley health check as described with respect to FIG. 5. The controller can use the verification operation to reduce the number of unnecessary entire block folding operations. For example, the controller might estimate a high severity (i.e., high risk failure) based on the collected data state metrics satisfying threshold conditions of a known-failure identifier. However, with the additional information the controller receives from the verification operation, the controller can determine that the data state metrics of a failure do not actually satisfy a high risk known-failure identifier(s), and consequently only a part of the set of cells needs to be folded (e.g., in a partial block fold). Thus, in this example, by implementing the verification operation, the controller can avoid performing an unnecessary folding operations.

At operation 730, the controller can identify, based on the severity of the failure, a failed subset of cells of the set of cells. The failed subset of cells can be connected with a common wordline, and/or be part of the same wordline group. In some embodiments, the failed subset of cells can be a part of the same page of the block. The failed subset of cells can include the failed memory cells directly associated with the failure (i.e., the memory cells that have failed), and can also include adjacent memory cells (e.g., in the form of cells along a wordline and/or adjacent wordlines). The failure at the failed memory cells can put adjacent memory cells at risk for subsequent failure, including data loss. The controller can identify adjacent at-risk memory cells based on the estimated severity of the failure resulting from the failed memory cells.

At operation 740, the controller can copy data from the failed subset of cells to a second set of cells of the memory device. For example, the controller can select a block ready for programming (e.g., from a programming pool) and program data that was stored at the failed subset of cells to the selected block. In some embodiments the selected block can be a new block. In some embodiments, after programming the at-risk data, the controller can program dummy data to the failed subset of cells, such that the block appears to be a filled block (i.e., a block that is not available to accept a programming operation) to the controller implementing future memory access operations.

FIG. 8 is a flow diagram of an example method 800 to according to some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the error handling component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, the controller implementing the method can detect a failure exhibited by a first block of a memory device. A failure can occur when the controller attempts to perform memory access operations, and the memory access operations are non-functional. In some embodiments, the cause of the non-functional behavior can be the result of physical defect of the memory device (i.e., a location on the memory device might be physically defective). The failure can be detected as part of normal memory processes (e.g., a read operation, program operation, garbage collection, etc.), or as a part of a failure detection process. Upon detecting the failure, the controller can indicate the failure with, for example, a failure flag. In some embodiments, the controller can indicate the failure with a program failure status.

At operation 820, the controller can estimate a severity of the failure. The controller can collect information (i.e., data state metrics) about the failure by performing a read strobe on the block. In some embodiments, the controller can analyze the voltage threshold sweep data with a read strobe. Based on the returned data state metrics about the wordlines of the block, the controller can determine whether data state metrics from the failure exhibited by the block satisfy corresponding threshold conditions of known-failure identifiers.

The memory sub-system can include a metadata structure of known-failure identifier threshold condition values that correspond to a given data state metric returned by the read strobe. The controller can determine whether the returned data state metric satisfies threshold conditions of the stored known-failure identifiers. In some embodiments, threshold conditions of the known-failure identifiers can be stored as metadata. Known-failure identifiers can be categorized by severity. In some embodiments, severity categories can include a high severity (i.e., high risk) and a low severity (i.e., low risk). The values of threshold conditions that define a high severity or a low severity can be determined during production of the memory device. In some embodiments, the controller can categorize known-failure identifiers as high risk or low risk, where high risk indicates that the risk of losing data across the whole block is higher than a risk threshold, and low risk indicates that the risk of losing data across the whole block is lower than a risk threshold. In some embodiments, the value of the risk threshold can be determined during production of the memory device. In some embodiments, the value of risk threshold can be dependent on the operating conditions of the memory device.

In some embodiments, when estimating the severity of the failure, the controller can identify wordlines directly associated with the failure (i.e., "failed wordline"). The failure can be related to a physical location and/or logical location of the failed memory cells on the memory device. For example, the failed wordline can be in the same wordline group, page, etc., and/or store the parts of a shared data object. The controller can estimate the severity of the failure by determining the likelihood the failure at the failed wordline will catastrophically affect the block containing the failed wordline. For example, if the failed wordline is unlikely to affect the data stored in other wordlines of the block (e.g., based on a categorization of the failure, and known responses to the known-failure identifier as determined, for example, during production of the memory device), the controller can categorize the failed wordline and resulting memory device failure as a low risk. However, if the failed wordline is likely to affect the data stored in other memory cells of the block (i.e., if data state metrics from the block satisfy a risk threshold), the controller can categorize the failed wordline and resulting memory device failure as a high risk. If the failure detected by the controller does not match any known-failure modes, the controller can assume a catastrophic failure, and categorize the failed wordline and resulting memory device failure as an unknown risk. In some embodiments, the controller can treat high risk failures and unknown risk failures as the same (e.g., the controller can fold the entire block for both high risk and unknown risk failure characterizations). In some embodiments, the quantity of failed wordline can indicate a severity.

The controller can initiate a verification operation to confirm that the threshold conditions of the known-failure identifier are satisfied by values from the data state metrics for the failed wordline. In some embodiments, the verification mode can be a known-failure check, such as a valley health check as described with respect to FIG. 5. The controller can use the verification operation to reduce the number of unnecessary entire block folding operations. For example, the controller might estimate a high severity (i.e., high risk failure) based on the collected data state metrics satisfying threshold conditions of a known-failure identifier. However, with the additional information the controller receives from the verification operation, the controller can determine that the data state metrics of a failure do not actually satisfy a high risk known-failure identifier(s), and consequently only part of the block needs to be folded (e.g., a partial block fold). Thus, in this example, by implementing the verification operation, the controller can avoid performing an unnecessary entire block folds.

At operation 830, the controller can identify, based on the severity of the failure, a failed wordline of the first block. The failed wordline be part of the same wordline group. In some embodiments, the failed wordline can be on different pages of the block. The failed wordline can include the failed wordline directly associated with the failure (i.e., the wordline that has failed), and can also include adjacent wordlines (e.g., directly adjacent wordlines, wordlines in the same wordline group, wordlines in the same page etc.). The failure at the failed wordline can put adjacent wordlines at risk for subsequent failure, including data loss. The controller can identify adjacent at-risk wordlines based on the estimated severity of the failure resulting from the failed wordline.

At operation 840, the controller can copy data from the failed wordline to a second block of the memory device. For example, the controller can select a block ready for programming (e.g., from a programming pool) and program data that was stored at the failed wordline to the selected block. In some embodiments, after programming the at-risk data, the controller can program dummy data to the failed subset of cells, such that the block appears to be a filled block (i.e., a block that is not available to accept a programming operation) to the controller implementing future memory access operations.

At operation 850, the controller can identify the first block as a partially failed block. The controller can store an identifier (e.g., a flag) for partially folded blocks containing the failed wordline in a metadata structure. In some embodiments, the controller can store an identifier for entirely folded blocks containing failed wordline in the metadata structure. In some embodiments, the controller can update the block identifier in the metadata structure. The controller can continue using partially failed blocks as if the partially failed blocks are un-failed blocks, provided the partially failed blocks have dummy data programmed to the failed wordlines, and indicators of which wordlines have failed. In some embodiments, the memory sub-system can store indicators of which wordlines of a given block have not failed.

At operation 860, responsive to initiating a garbage collection operation, the controller can retire the partially failed block. The metadata structure with block identifier(s) of blocks containing failed wordline can be referenced by the controller during garbage collection. For example, during garbage collection, the controller can check whether the current block (i.e., the block on which the controller is performing garbage collection) has a block identifier stored in the metadata structure. If a block identifier for the current block is stored in the metadata structure, the controller can remove the current block from available memory through block retirement.

Figure 9:
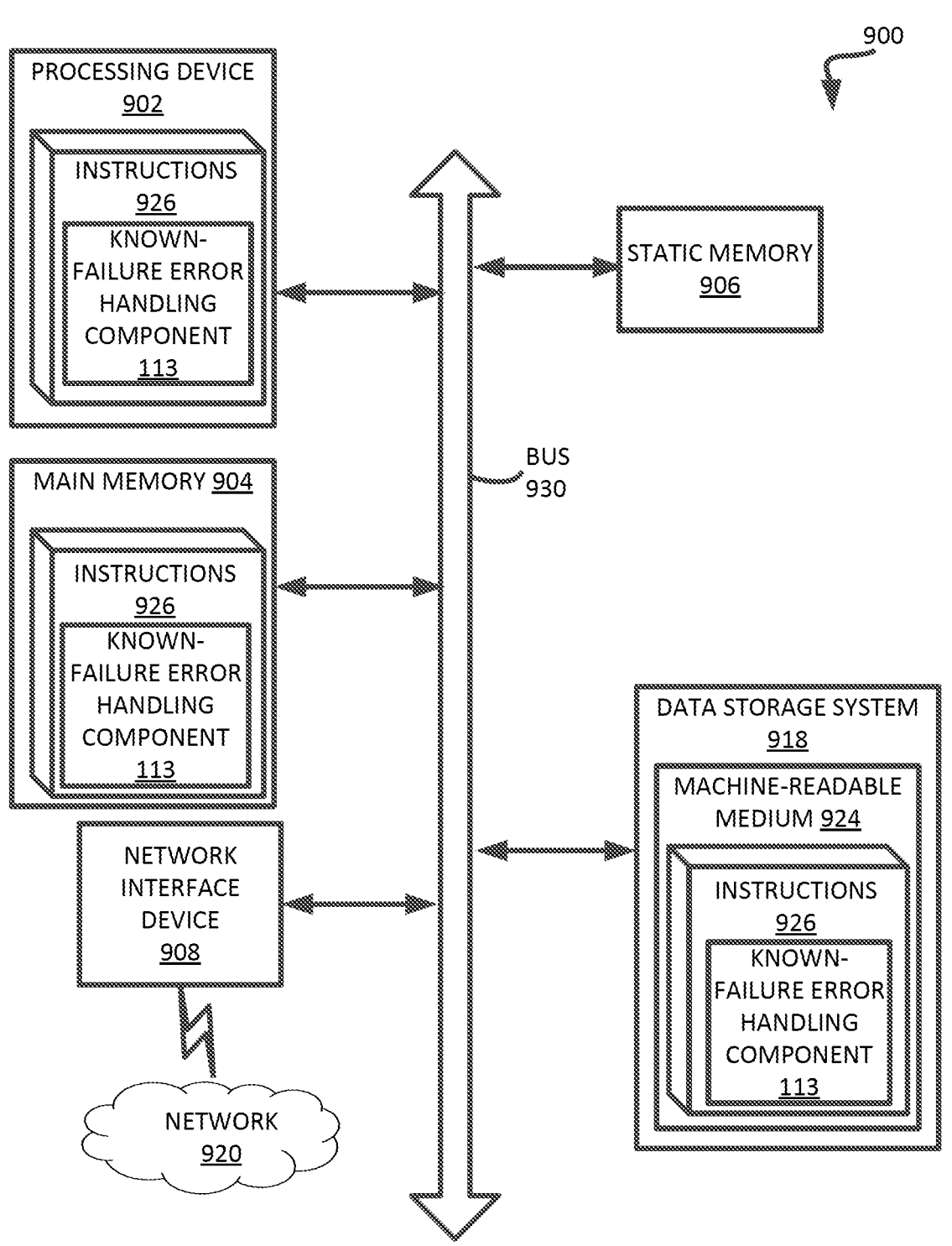
FIG. 9 is a block diagram of an example computer system in which embodiments of the present disclosure can operate.

FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the error handling component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or RDRAM, etc.), a static memory 906 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920.

The data storage system 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1.

In one embodiment, the instructions 926 include instructions to implement functionality corresponding to a known-failure error handling component (e.g., the error handling component 113 of FIG. 1). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, the processing device to perform operations comprising:
detecting a failure exhibited by a first set of cells of the memory device;
estimating a severity of the failure;
identifying, based on the severity of the failure, a failed subset of cells of the first set of cells;
copying data from the failed subset of cells to a second set of cells of the memory device;
identifying an adjacent subset of cells of the first set of cells that are adjacent to the failed subset of cells; and
programming first dummy data to the failed subset of cells and second dummy data to the adjacent subset of cells.

2. The system of claim 1, wherein estimating the severity of the failure further comprises:
determining whether the failure exhibited by the first set of cells corresponds to a known-failure mode; and
initiating a verification operation based on the known-failure mode.

3. The system of claim 2, wherein determining whether the failure exhibited by the first set of cells corresponds to the known-failure mode further comprises:
determining whether metadata associated with the first set of cells satisfies a threshold condition of one or more known-failure identifiers of the known-failure mode.

4. The system of claim 1, wherein the failure is caused by a physical defect of the failed subset of cells.

5. The system of claim 1, wherein estimating the severity of the failure further comprises:
responsive to determining that a voltage distribution of a set of voltage distributions for the first set of cells has shifted, determining a voltage shift of the voltage distribution; and
adjusting an estimate of the severity of the failure based on the voltage shift.

6. The system of claim 1, the operations further comprising:
identifying the first set of cells as a partially failed set of cells.

7. The system of claim 1, the operations further comprising:
precluding the first set of cells from being used by a memory write operation.

8. A method comprising:
detecting, by a processing device, a failure exhibited by a first set of cells of a memory device;
estimating a severity of the failure;
identifying, based on the severity of the failure, a failed subset of cells of the first set of cells;
copying data from the failed subset of cells to a second set of cells of the memory device;
identifying an adjacent subset of cells of the first set of cells that are adjacent to the failed subset of cells; and
programming first dummy data to the failed subset of cells and second dummy data to the adjacent subset of cells.

9. The method of claim 8, wherein estimating the severity of the failure further comprises:

determining whether the failure exhibited by the first set of cells corresponds to a known-failure mode; and initiating a verification operation based on the known-failure mode.

10. The method of claim 9, wherein determining whether the failure exhibited by the first set of cells corresponds to the known-failure mode further comprises:

determining whether metadata associated with the first set of cells satisfies a threshold condition of one or more known-failure identifiers of the known-failure mode.

11. The method of claim 8, wherein the failure is caused by a physical defect of the failed subset of cells.

12. The method of claim 8, wherein estimating the severity of the failure further comprises:

responsive to determining that a voltage distribution of a set of voltage distributions for the first set of cells has shifted, determining a voltage shift of the voltage distribution; and adjusting an estimate of the severity of the failure based on the voltage shift.

13. The method of claim 8, further comprising:

identifying the first set of cells as a partially failed set of cells.

14. The method of claim 8, further comprising:

precluding the first set of cells from being used by a memory write operation.

15. A non-transitory computer-readable storage medium comprising instructions that, when executed by a processing device, cause the processing device to perform operations comprising:

detecting a failure exhibited by a first set of cells of a memory device;

estimating a severity of the failure;

identifying, based on the severity of the failure, a failed subset of cells of the first set of cells; and copying data from the failed subset of cells to a second set of cells of the memory device;

identifying an adjacent subset of cells of the first set of cells that are adjacent to the failed subset of cells; and programming first dummy data to the failed subset of cells and second dummy data to the adjacent subset of cells.

16. The non-transitory computer-readable storage medium of claim 15, the operations further comprising:

determining whether metadata associated with the first set of cells satisfies a threshold condition of one or more known-failure identifiers of a known-failure mode.

17. The non-transitory computer-readable storage medium of claim 15, the operations further comprising:

identifying the first set of cells as a partially failed set of cells; and precluding the partially failed set of cells from being used by a memory write operation.

* * * * *